United States Patent
Kayanakis et al.

(10) Patent No.: US 6,536,674 B2
(45) Date of Patent: Mar. 25, 2003

(54) PROCESS FOR MANUFACTURING A CONTACTLESS SMART CARD WITH AN ANTENNA SUPPORT MADE OF FIBROUS MATERIAL

(75) Inventors: Georges Kayanakis, Antibes (FR); Christophe Mathieu, Saint Marcel (FR); Sébastien Delenne, Trets (FR)

(73) Assignee: ASK S.A., Sophia Antipolis (FR)

(*) Notice: Subject to any disclaimer, the term of this patent is extended or adjusted under 35 U.S.C. 154(b) by 0 days.

(21) Appl. No.: 09/725,077

(22) Filed: Nov. 29, 2000

(65) Prior Publication Data
US 2001/0006194 A1 Jul. 5, 2001

(30) Foreign Application Priority Data
Nov. 29, 1999 (FR) ............................................. 99 15019

(51) Int. Cl.$^7$ ................................................ G06K 19/06
(52) U.S. Cl. ................. 235/492; 235/492; 235/488; 235/489; 235/442; 361/737; 257/679
(58) Field of Search ........................... 235/380, 492, 235/487

(56) References Cited

U.S. PATENT DOCUMENTS

| | | | | |
|---|---|---|---|---|
| 4,725,924 A | | 2/1988 | Juan ........................... 361/398 |
| 4,841,134 A | | 6/1989 | Hida et al. .................. 235/488 |
| 5,495,250 A | | 2/1996 | Ghaem et al. ............... 342/51 |
| 5,598,032 A | | 1/1997 | Fidalgo ....................... 257/679 |
| 5,888,624 A | * | 3/1999 | Haghiri et al. .............. 428/195 |
| 5,898,215 A | * | 4/1999 | Miller et al. ................ 257/679 |
| 5,913,110 A | * | 6/1999 | Herbst ......................... 438/126 |
| 5,955,021 A | * | 9/1999 | Tiffany, III ............. 264/272.11 |
| 5,969,951 A | * | 10/1999 | Fischer et al. .............. 361/737 |
| 6,025,054 A | * | 2/2000 | Tiffany, III ................. 428/189 |
| 6,068,192 A | * | 5/2000 | McCabe et al. ............. 235/487 |
| 6,151,511 A | | 11/2000 | Cruciani ..................... 455/558 |
| 6,161,761 A | | 12/2000 | Ghaem et al. .............. 235/492 |
| 6,173,898 B1 | | 1/2001 | Mande ........................ 235/488 |
| 6,223,989 B1 | | 5/2001 | Permingeat ................. 235/487 |
| 6,250,555 B1 | * | 6/2001 | Inamoto ...................... 235/487 |

FOREIGN PATENT DOCUMENTS

| | | |
|---|---|---|
| DE | 44 03 513 | 8/1995 |
| DE | 196 01 358 | 7/1996 |
| DE | 196 32 115 | 12/1997 |
| EP | 198 376 | 10/1986 |
| EP | 615 285 | 9/1994 |
| FR | 615 285 | 1/1927 |
| FR | 2 769 440 | 4/1999 |
| JP | 2000-113151 | 4/2000 |
| JP | 2000-113155 | 4/2000 |
| JP | 2000-155821 | 6/2000 |
| WO | WO 94/11846 | 5/1994 |

\* cited by examiner

Primary Examiner—Michael G. Lee
Assistant Examiner—Ahshik Kim
(74) Attorney, Agent, or Firm—James C. Lydon

(57) ABSTRACT

The present invention relates to a contactless smart card manufacturing process and more specifically to a manufacturing process for a contactless smart card for which the antenna is on a fibrous material such as paper. This process includes a manufacturing step to screen print the antenna onto the support, a step to bond the contacts of the chip onto the antenna support using conductive glue, and a step designed to laminate the card body onto the antenna support by hot press molding. Cutouts made in the corners of the antenna support prior to the lamination step enable the card bodies to be bonded together. The card thus obtained allows a posteriori viewing of any mechanical misuse to which it may have been subjected (extreme bending).

8 Claims, 2 Drawing Sheets

PROCESS FOR MANUFACTURING A CONTACTLESS SMART CARD WITH AN ANTENNA SUPPORT MADE OF FIBROUS MATERIAL

TECHNICAL FIELD

The present invention relates to smart card manufacturing processes, and more specifically a contactless smart card manufacturing process for which the antenna is on a support made of fibrous material such as paper.

PRIOR ART

The contactless smart card is a system being used increasingly in various sectors. In the transport sector, the card has been developed as a means of payment. The same holds true for the electronic wallet. Many companies have also developed identification means for their personnel using contactless smart cards.

The exchange of information between a contactless card and the reader takes place via remote electromagnetic coupling between an antenna embedded in the contactless card and a second antenna in the reader. In order to create, store and process the information, the card is equipped with a chip which is connected to the antenna. The antenna and the chip are generally located on a dielectric support made of plastic. The standard industrial manufacturing process for these components can be broken down into three steps:

- the antenna is made on a plastic dielectric support (polyvinyl chloride (PVC), polyesters (PET), polycarbonate (PC) . . . ) using copper or aluminum etching techniques,
- the connection of the chip's contact pads to the antenna's contact pads using electrically-conductive ink or epoxy or polymers, commonly referred to as the "flip-chip" die bonding technique.
- hot-lamination under pressure of the upper and lower plastic layers of the card body (PVC, PET, PC, acrylonitrile-butadienestyrene (ABS) . . . ), onto the antenna support in order to create a monobloc card.

However, this process generates several major drawbacks. The process leads to a composite stack of glued or heat bonded plastic materials with different thermal expansion coefficients. As a result, systematic unacceptable and irreversible deformation of the cards is observed (twisting, warping), as well as a lack of mechanical resistance when subjected to standardized or equivalent tests.

Furthermore, PVC exhibits poor thermomechanical properties. During the lamination process, material flow is significant and the antenna's shape factor is not maintained. This leads to antenna malfunction as the electrical parameters (inductance and resistance) vary. It is not uncommon to experience antenna breakage in areas subjected to strong sheer stresses. This is particularly the case in angles and at electrical bridging points.

The laminated ISO cards have a total thickness between 780 and 840 $\mu$m. Considering the material flows described above, it is also very difficult to guarantee customers a narrow and controlled distribution of the cards' population.

The plastic heat bonding process used during the lamination operation creates a monobloc card with poor mechanical properties in terms of the restitution of absorbed stresses: during standardized bending and twisting tests, all of the stress applied is transmitted to the chip and primarily to the bonding points which make the connections. The mechanical strength of the bonding joints is subjected to great strain and the slightest imperfection of the chip die bonding operation on the antenna ("flip-chip" die bonding technique) causes the chip—antenna electrical connection to break.

After lamination, the imprint from the copper etching is visible on the printed card bodies. Although this does not prevent the card from operating correctly, the defect is often emphasized by users who are very concerned about the aesthetic criteria.

Furthermore, the cost of manufacturing the card with this process is too high to enable any real increase in its usage.

Lastly, the processes currently used do not produce cards with the possibility to view the poor mechanical treatment inflicted on them by the users, particularly for the purpose of frauding. It is in fact relatively easy for someone with experience in card fraud to destroy the card by folding it repeatedly without it being possible to easily prove any malicious intent afterwards. For example, the antenna may be cut without the card being marked. Commercial policies set up within companies generally ensure the replacement of defective cards free of charge. The systematic replacement of these cards is a source of major supplementary costs for these companies.

SUMMARY OF THE INVENTION

The purpose of the invention is to mitigate these drawbacks by supplying an inventive manufacturing process using a support made of fibrous material on which an antenna is screen printed using electrically conductive ink, thereby significantly reducing the production costs of hybrid or contactless smart cards.

The invention thus relates to a manufacturing method of a contactless smart card with an antenna support made of fibrous material such as paper, which includes the following steps:

A manufacturing process of the antenna consisting in screen printing turns of electrically conductive polymer ink on a support made of fibrous materials and to subject said support to a heat treatment in order to bake said ink, a bonding step using electrically conductive adhesive to bond the chip's bonding pads onto the antenna's bonding pads, and A step for laminating the card bodies onto the antenna support consisting in welding on each side of the support at least two sheets of plastic material, forming the card bodies, by a hot press molding technique.

BRIEF DESCRIPTION OF THE DRAWINGS

The purposes, objects and characteristics of the invention will become more apparent from the following description when taken in conjunction with the accompanying drawings in which.

DETAILED DESCRIPTION OF THE PREFERRED EMBODIMENTS

Figure 1A:
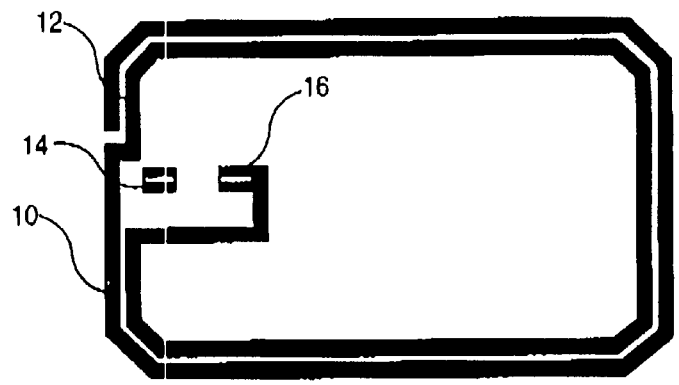
FIGS. 1A to 1C represent the various steps used in screen printing the antenna on the support.
Figure 1B:
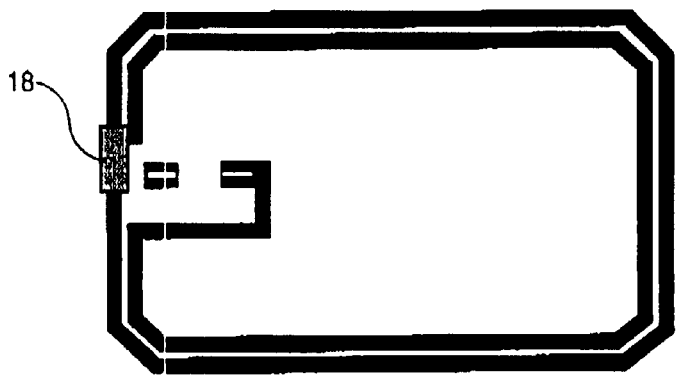
Figure 1C:
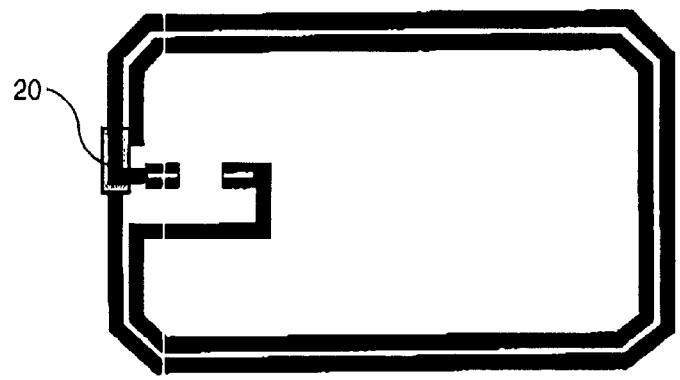

The smart card manufacturing process according to the invention initially consists of placing the antenna on a support. This support is made of a sheet of fibrous material such as paper. According to a preferred embodiment of the manufacturing process, the antenna is screen printed on this material in several steps. The first step, represented in FIG. 1A, consists in screen printing the two turns 10 and 12 and the two bonding pads of the antenna 14 and 16. The second step, represented in FIG. 1B consists in screen printing an insulating strip to allow turns 10 and 12 to overlap without electrical contact. The third step, represented in FIG. 1C, consists in screen printing the electrical bridge 20 which connects turn 10 to bonding pad 14.

Figure 2:
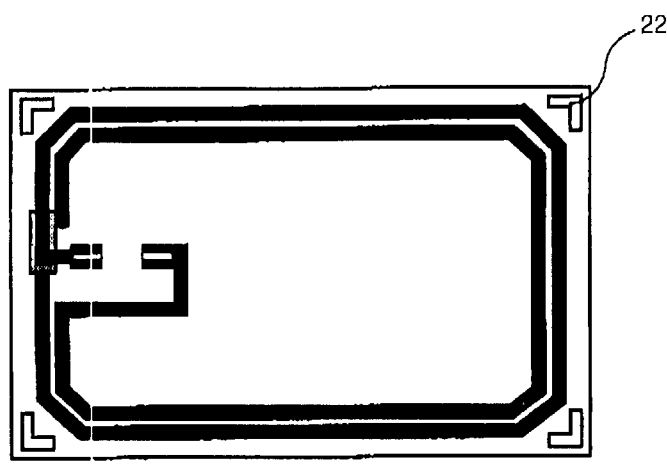
FIG. 2 represents the support with the screen printed antenna prior to the lamination step.

Once the antenna has been screen printed on the support, it is cut to the dimensions of the card. According to a preferred embodiment, a cutout 22 is made in each corner of the support, as shown in FIG. 2. This cutout enables a direct weld between the card bodies during the lamination process.

Lamination is carried out by hot press molding. According to a preferred embodiment, two layers of plastic material are used for each card body. This plastic material is generally polyvinyl chloride (PVC), polyester (PET, PETG), polycarbonate (PC) or acrylonitrile-butadiene-styrene (ABS). According to a preferred embodiment, PVC is used. The two layers have different stiffness. The external layer is made of rigid PVC, while the inside layer (in contact with the antenna support) is made of soft PVC with a lower Vicat softening temperature (the temperature at which the PVC shifts from a rigid state to a rubbery state). The two layers may also be of different thickness. For example, each of the card bodies consists of an external rigid PVC layer of approximately 310 microns ($\mu$m) thick and an internal soft PVC layer of approximately 80 $\mu$m thick. The antenna support is made of paper approximately 125 $\mu$m thick. According to another manufacturing example, which is a preferred embodiment, each one of the card bodies is comprised of three layers. A cover, consisting of a transparent PVC sheet or varnish layer, is added on the external layer of the card body when it is printed in order to protect the printing. This cover is approximately 40 $\mu$m thick. The external layer of the card body is thus 275 $\mu$m thick and the internal layer approximately 40 $\mu$m thick.

The lamination step consists of stacking together the various layers of PVC which form the card body and the antenna support. This sandwich is then placed in a lamination press. The sandwich is heat treated at a temperature greater than 100° C., and preferably greater than 150° C. At the same time, the sandwich is pressed in order to fuse the various layers together. Under the combined action of heat and pressure, the external PVC softens and the internal layer made of PVC with a lower Vicat softening temperature then liquefies. The liquefied PVC traps the screen printed ink of the antenna within the mass of the card offering it enhanced resistance to the mechanical stresses encountered during smart card usage. Furthermore, the antenna adheres to the card body better. This adherence may be enhanced by using pressure-sensitive doubleface tape placed between the card body and the antenna.

The cutouts 22 made in the corners of the antenna support allow the two internal PVC layers to come into contact with one another. By blocking the corners by welding the two card bodies together, all of the mechanical stresses are directed inside the card. In the case of the paper, paper pulp exhibits low internal cohesion. When it is subjected to sheer forces, the core of the paper tends to delaminate. If these stresses are too strong, the card opens up and splits in two parts (the part which contains the antenna connected to the module continues to function). In this manner, by acting on the type of paper and on its internal cohesion, we can benefit from this physical property in order to create a card with a built-in and variable stress marker. According to the customer's needs, delamination may thus be more or less rapid and more or less significant so that limited flexion of the card may be seen owing to the delamination of the paper inside the card.

Figure 3:
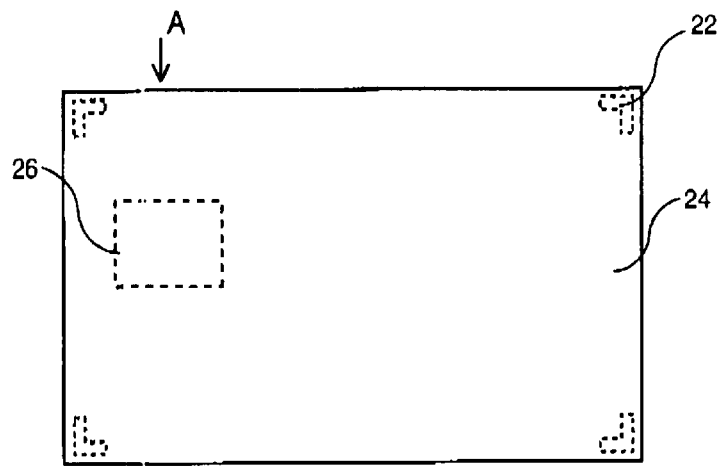
FIG. 3 represents the smart card at the end of the manufacturing process.

Once this step is terminated, a card as shown in FIG. 3 is obtained. The bodies of the card 24 are heat bonded together in the corners via the cutouts 22 on the antenna support. The chip 26 is embedded in the card and is thus not visible.

Figure 4:
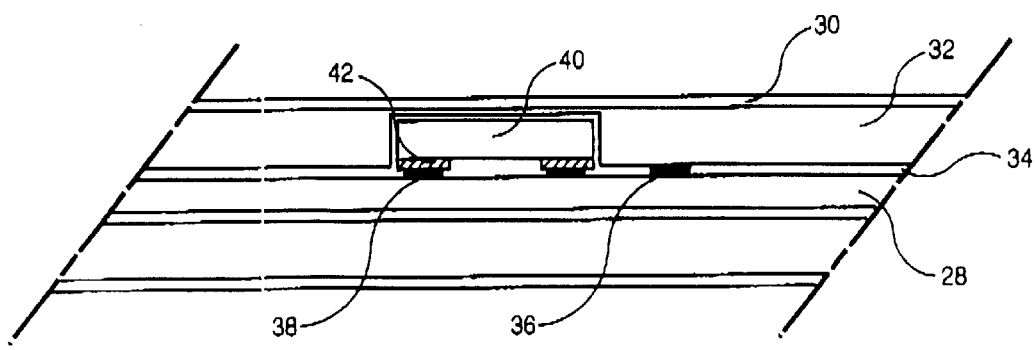
FIG. 4 represents a cross section of the smart card, represented in FIG. 3, along the axis A—A of FIG. 3.

FIG. 4 is a cross sectional view along axis A—A of the smart card represented in FIG. 3. The card consists of an antenna support 28 made of fibrous material, inserted between the two card bodies. Each card body contains a cover 30 which consists of a sheet of transparent PVC film or varnish layer, an external rigid PVC layer 32 and an internal soft PVC layer 34. The turn 36 and the bonding pads are trapped in the internal layer 34 of the card body's PVC mass. The chip 40 is connected to the bonding pads of the antenna 38 by a layer of conductive glue 42. This conductive glue is conductive ink, epoxy or polymer based. According to a specific embodiment, bonding is carried out in accordance with the process commonly referred to as "flip-flop" die bonding technique.

The process according to the invention offers a card having two major qualities for the companies which use it: the preservation of the electrical components provide this card with enhanced solidity and, in case of card malfunction, the delamination property of the fibrous materials such as the paper allows to make sure that the card has not been subjected to intensive folding for the purpose of frauding.

What is claimed is:

1. A manufacturing process of a contactless smart card with an antenna support made of fibrous material such as paper, comprised of the following steps:

a manufacturing process of the antenna consisting in screen printing turns of electrically conductive polymer ink on a support made of at least one fibrous material and to subject said support to a heat treatment in order to bake said ink, a bonding step using electrically conductive adhesive to bond the chip's bonding pads onto the antenna's bonding pads, and a step which laminates the card bodies onto the antenna support consisting in welding each side of said support to at least two sheets made of plastic material having different stiffness, forming the card bodies, by a hot press molding process, and wherein, during the antenna manufacturing process, the corners of the antenna support are notched in order to allow the two card bodies to be welded together; said card obtained thereby offering a preferential delamination zone which will highlight any act of deliberate damage posterior.

2. The smart card manufacturing process according to claim 1, wherein the sheet forming the external layer of the card body is stiffer than the sheet forming the internal layer of the card body, said internal layer having a low Vicat softening temperature.

3. A smart card manufacturing process, according to claim 1, in which the two sheets each forming card bodies are of different thickness.

4. A smart card manufacturing process according to claim 3, in which the sheet forming the external layer is thicker that the sheet forming the internal layer.

5. A process for manufacturing a smart card according to claim 1, in which, during the hot lamination step of the card bodies onto the antenna support, a third sheet of plastic material or varnish layer is added to each card body which acts as a cover.

6. A smart card manufacturing process according to claim 1, in which the plastic material forming the card bodies is polyvinyl chloride (PVC), polyester (PET, PETG), polycarbonate (PC) or acrylonitrile-butadiene-styrene (ABS).

7. A smart card manufacturing process according to claim 1, in which the conductive glue used to bond the bonding pads of the chip onto the bonding pads of the antenna is electrically conductive ink, epoxy or polymer based.

8. The smart card manufacturing process according to claim 1, wherein said fibrous material comprises paper.

* * * * *